United States Patent [19]

Shimada

[11] Patent Number: 4,538,076
[45] Date of Patent: Aug. 27, 1985

[54] LEVEL CONVERTER CIRCUIT

[75] Inventor: Hiroshi Shimada, Tokyo, Japan

[73] Assignee: Fujitsu Limited, Kawasaki, Japan

[21] Appl. No.: 392,750

[22] Filed: Jun. 28, 1982

[30] Foreign Application Priority Data

Jun. 30, 1981 [JP] Japan ............................... 56-102875

[51] Int. Cl.³ ........................................... H03K 19/092
[52] U.S. Cl. ................................... 307/475; 307/264; 307/446; 307/315
[58] Field of Search ............... 307/475, 264, 446, 268, 307/315

[56] References Cited

U.S. PATENT DOCUMENTS

| 3,660,676 | 5/1972 | Fleischhammer et al. | |
| 3,684,897 | 8/1972 | Anderson et al. | |
| 3,959,666 | 5/1976 | Fett et al. | 307/475 |
| 4,128,775 | 12/1978 | Frederiksen et al. | 307/264 |
| 4,164,747 | 8/1979 | Gerstner | 307/315 |

OTHER PUBLICATIONS

Bell Laboratories Record, "Bigfet Makes IGFET More Versatile", by G. T. Cheney et al., vol. 50, No. 6, Jun.-/Jul. 1972, pp. 195-198.

Primary Examiner—John Zazworsky
Attorney, Agent, or Firm—Staas & Halsey

[57] ABSTRACT

A level converter circuit for converting a first logic signal using a lower voltage supply as a base potential into a second logic signal using a higher voltage supply as a base potential. The level converter circuit comprises first and second bipolar transistors, the base potential of the second logic signal being applied to the collectors of the first and second bipolar transistors, the emitter of the first bipolar transistor being connected to the base of the second bipolar transistor, and the emitter of the second bipolar transistor being used for the output terminal of the level converter circuit, and means for turning on the second bipolar transistor or both bipolar transistors in response to the first logic signal applied to the input terminal.

8 Claims, 9 Drawing Figures

LEVEL CONVERTER CIRCUIT

BACKGROUND OF THE INVENTION

The present invention relates to a level converter circuit, more particularly to a level converter circuit which converts the signal level being output from an integrated circuit (IC) memory device and the like into another arbitrary signal level.

Recently, it is often necessary to couple the output signals of transistor-transistor logic (TTL) or metal oxide semiconductor (MOS) IC's with the inputs of emitter coupled logic (ECL) IC's or to couple the output signals of ECL IC's with the input of TTL or MOS IC's. For example, the output signals of a random access memory (RAM) comprising MOS IC's may be coupled with the inputs of a logic circuit comprising ECL IC's. In such a case, it is necessary to convert the TTL signal level into an ECL signal level. Generally, for the TTL level, ground potential $V_{SS}$ is used as the base potential, for example, 0 V, and a voltage $V_{CC}$, higher than ground potential $V_{SS}$ by, for example, 5 V, is used as the voltage supply. For the ECL level, ground potential $V_{SS}$ is used as the base potential, for example, 0 V, and a voltage $V_{EE}$, lower than ground potential $V_{SS}$ by, for example, $-5.2$ V, is used as the voltage supply.

A prior art level converter circuit used for converting a TTL level into an ECL level is illustrated in FIG. 1. The level converter circuit of FIG. 1 comprises buffer circuit $B_1$, PNP transistor $Q_1$, and resistors $R_1$, $R_2$, and $R_3$. The operation of the level converter circuit of FIG. 1 is illustrated in FIG. 2. The input signal supplied to the input terminal I.P. of the level converter circuit of FIG. 1 is a TTL level signal in the range between 0 V ($V_{SS}$) and $+5.0$ V ($V_{CC}$), as shown in FIG. 2. In the TTL level signal, the maximum level of the low "L" level signal is $+0.4$ V and the minimum level of the high "H" level signal is $+2.4$ V. The output signal of the level converter circuit of FIG. 1 is an ECL level signal in the range between 0 V ($V_{SS}$) and $-5.2$ V ($V_{EE}$). In the ECL level signal, the maximum level of the "L" level signal is $-1.6$ V, and the minimum level of the "H" level signal is $-0.8$ V.

The "H" level signal $V_{H1}$ of the TTL level supplied to the input terminal I.P. is converted into the "H" level signal $V_{H2}$ of the ECL level by the level converter circuit. The converted signal is output from output terminal O.P. Similarly, the "L" level signal $V_{L1}$ of the TTL level supplied to the input terminal I.P. is converted into "L" level signal $V_{L2}$ of the ECL level by the level converter circuit. The converted signal is output from output terminal O.P.

As described above, in the level converter circuit of FIG. 1, three voltage supply lines $+5.0$ V, 0 V, and $-5.2$ V are necessary. However, using three voltage supply lines is disadvantageous for increasing the integration scale of the IC.

SUMMARY OF THE INVENTION

The main object of the present invention is to provide a level converter circuit in which the output signal level of the TTL or MOS IC, being operated between the two voltage supplies, is converted into another signal level. The output signal is supplied to the input of another type of IC, for example, an ECL IC.

In accordance with the present invention, there is provided a level converter circuit for converting a first logic signal, using a lower voltage supply as a base potential, into a second logic signal, using a higher voltage supply as a base potential. The level converter circuit comprises an input terminal for receiving the first logic signal, an output terminal for outputting the second logic signal, a first bipolar transistor having a collector connected to the higher voltage supply, a second bipolar transistor connected between the higher voltage supply and the output terminal, the second bipolar transistor having a base connected to an emitter of the first bipolar transistor, and means for turning on the second bipolar transistor or both bipolar transistors in response to the first logic signal applied to the input terminal.

DESCRIPTION OF THE PREFERRED EMBODIMENTS

Figure 1:
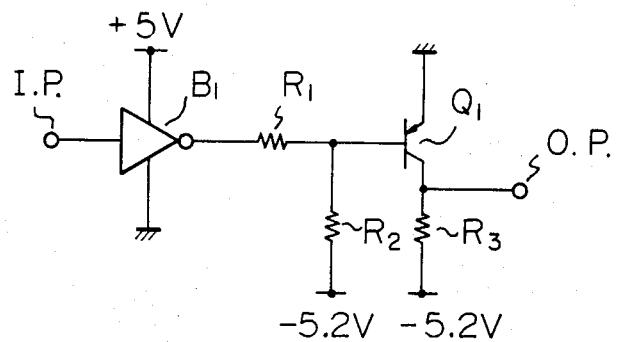
FIG. 1 is a circuit diagram of a prior art level converter circuit.
Figure 2:
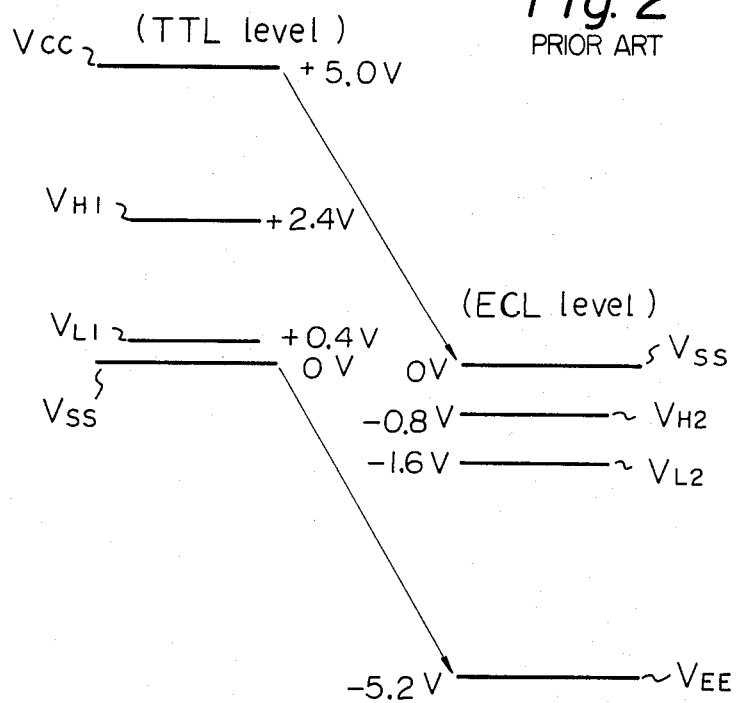
FIG. 2 is a level conversion diagram in the circuit of FIG. 1.
Figure 3:
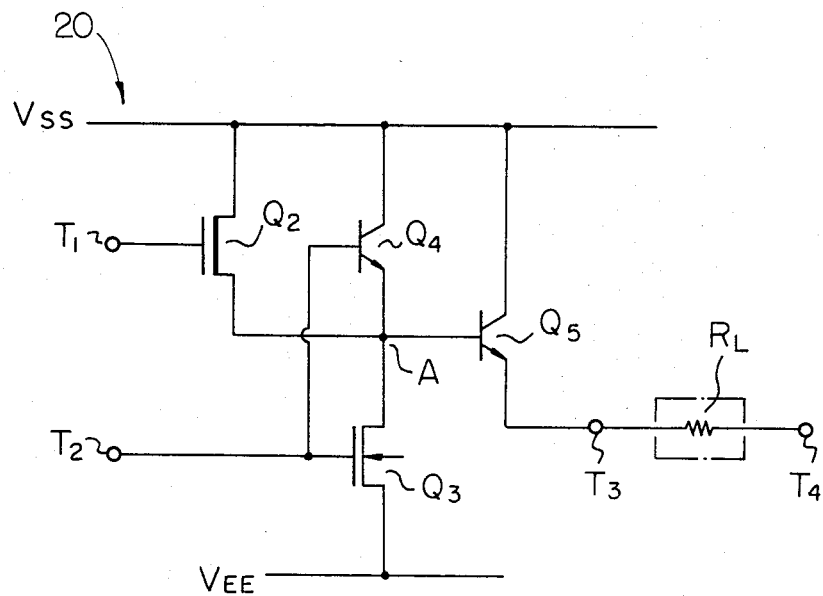
FIG. 3 is a circuit diagram of a level converter circuit in accordance with a first embodiment of the present invention.

A level converter circuit in accordance with the first embodiment of the present invention is illustrated in FIG. 3. The level converter circuit of FIG. 3 comprises a depletion type MOS transistor $Q_2$, an enhancement type MOS transistor $Q_3$, and NPN-type bipolar transistors $Q_4$ and $Q_5$.

In the level converter circuit 28 of FIG. 3, MOS transistors $Q_2$ and $Q_3$ are connected in series between voltage supply lines $V_{SS}$ and $V_{EE}$. The gates of MOS transistors $Q_2$ and $Q_3$ are connected to input terminals $T_1$ and $T_2$, respectively. A junction A between the source of MOS transistor $Q_2$ and the drain of MOS transistor $Q_3$ is also connected to the emitter of the bipolar transistor $Q_4$ and the base of the bipolar transistor $Q_5$. The collectors of bipolar transistors $Q_4$ and $Q_5$ are both connected to the voltage supply line $V_{SS}$. The base of the bipolar transistor $Q_4$ is connected to input terminal $T_2$. The emitter of bipolar transistor $Q_5$ is connected to output terminal $T_3$.

Output terminal $T_3$ may be connected to an ECL circuit or another type of circuit. In FIG. 3, the output terminal $T_3$ is connected to one end of a dummy load resistor $R_L$ equivalent to an ECL circuit. The other end of the resistor $R_L$ is connected to an external voltage supply terminal $T_4$. An arbitrary voltage may be applied to terminal $T_4$ corresponding to the dummy load resistor $R_L$. For example, resistor $R_L$ may be 50 Ω and the voltage applied to the terminal $T_4$ may be $-2.0$ V with regard to voltage supply $V_{SS}$.

Figure 4:
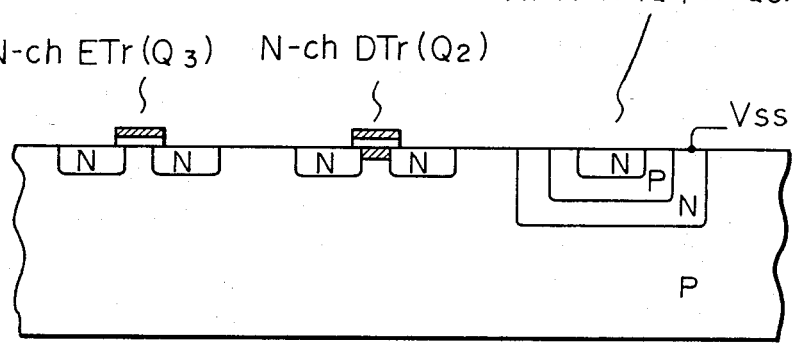
FIG. 4 is a sectional view of a semiconductor substrate on which the circuit of FIG. 3 is formed.
Figure 9:
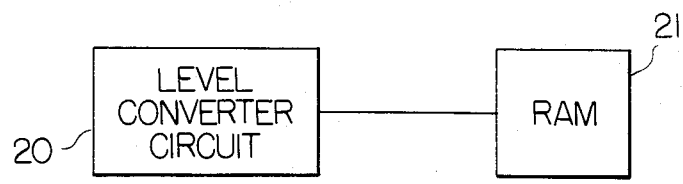
FIG. 9 is a block diagram of a level converter and a RAM formed on the same substrate in accordance with another embodiment of the present invention.

The level converter circuit may be formed on the same IC semiconductor substrate on which a RAM 21 device is formed as illustrated in FIG. 9. FIG. 4 illustrates a sectional view of the P-type semiconductor substrate on which the MOS transistors $Q_2$, $Q_3$ and bipolar transistor $Q_4$ are formed. As shown in FIG. 4, NPN transistor $Q_4$ is formed in the N-well formed in the P-type substrate.

In the level converter circuit of FIG. 3, the higher voltage supply line $V_{SS}$ may be ground potential, for example, 0 V. The lower voltage supply line $V_{EE}$ may be $-5.2$ V. A logic signal $S_1$, alternating between $V_{SS}$ and $V_{EE}$, is applied to the input terminal $T_1$. An inverted signal $S_2$ of the logic signal $S_1$ is applied to input terminal $T_2$.

Thus, when the "H" level signal ($V_{SS}$) is applied to terminal $T_1$, the "L" level signal ($V_{EE}$) is applied to terminal $T_2$. In this case, MOS transistor $Q_2$ is turned ON, and MOS transistor $Q_3$ and bipolar transistor $Q_4$ are turned OFF. Accordingly, the voltage of the junction A, that is, the base voltage of the bipolar transistor $Q_5$, becomes the "H" level ($V_{SS}$) through the MOS transistor $Q_2$, and the bipolar transistor $Q_5$ is turned ON. Since the emitter of the bipolar transistor $Q_5$ is connected to the external voltage supply through the dummy load resistor $R_L$, the current flows between the collector and emitter of bipolar transistor $Q_5$. The emitter voltage of bipolar transistor $Q_5$ becomes the value $V_{SS}-V_{BE}$, that is, the voltage is lower than the base voltage of the bipolar transistor $Q_5$ by the amount of the base-emitter voltage $V_{BE}$. Thus, the "H" level voltage of the ECL level is obtained at output terminal $T_3$.

Then, when the "L" level signal ($V_{EE}$) is applied to the input terminal $T_1$ and the "H" level signal ($V_{SS}$) is applied to the input terminal $T_2$, MOS transistor $Q_2$ is turned OFF and MOS transistor $Q_3$ and bipolar transistor $Q_4$ are turned ON. Accordingly, the current flows through bipolar transistor $Q_4$ and MOS transistor $Q_3$, and the emitter voltage of bipolar transistor $Q_4$ becomes lower than the voltage $V_{SS}$ of the input terminal $T_2$ by the amount of the base-emitter voltage $V_{BE}$ of the bipolar transistor $Q_4$. Since the emitter voltage of the bipolar transistor $Q_4$ is applied to the base of the bipolar transistor $Q_5$, the bipolar transistor $Q_5$ is turned ON, and the emitter voltage of bipolar transistor $Q_5$ becomes lower than the base voltage by the amount of the base-emitter voltage $V_{BE}$ of the bipolar transistor $Q_5$. Thus, the voltage $V_{SS}-2V_{EB}$ is obtained at the output terminal $T_3$. This voltage is used as the "L" level signal of the ECL level.

Figure 5:
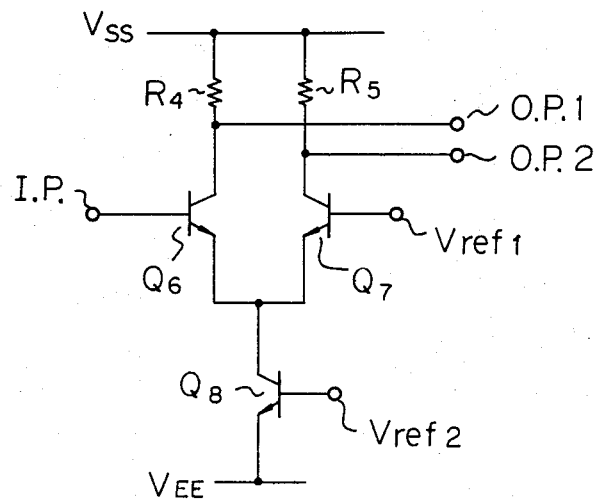
FIG. 5 is a circuit diagram of a typical ECL circuit.
Figure 6:
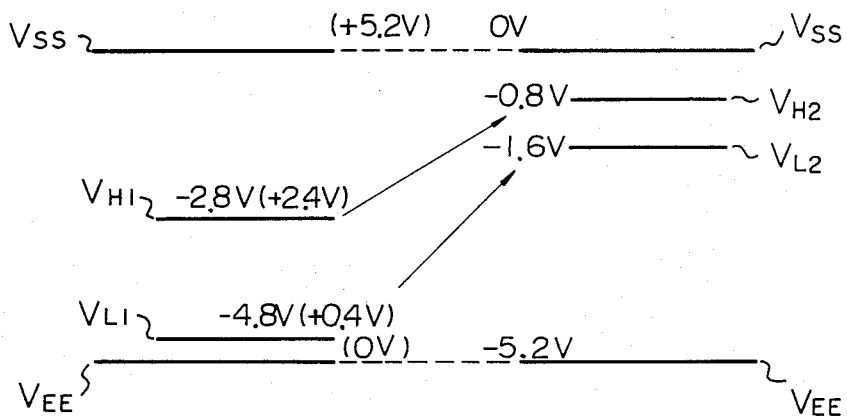
FIG. 6 is a level conversion diagram according to the present invention.

As described above, the output signal of the level converter circuit of FIG. 3 can be directly applied to the input of the typical ECL circuit shown in FIG. 5. The ECL circuit of FIG. 5 comprises NPN type bipolar transistors $Q_6$, $Q_7$, and $Q_8$ and resistors $R_4$ and $R_5$. The level conversion according to the level converter circuit of FIG. 3 is illustrated in FIG. 6.

Figure 7:
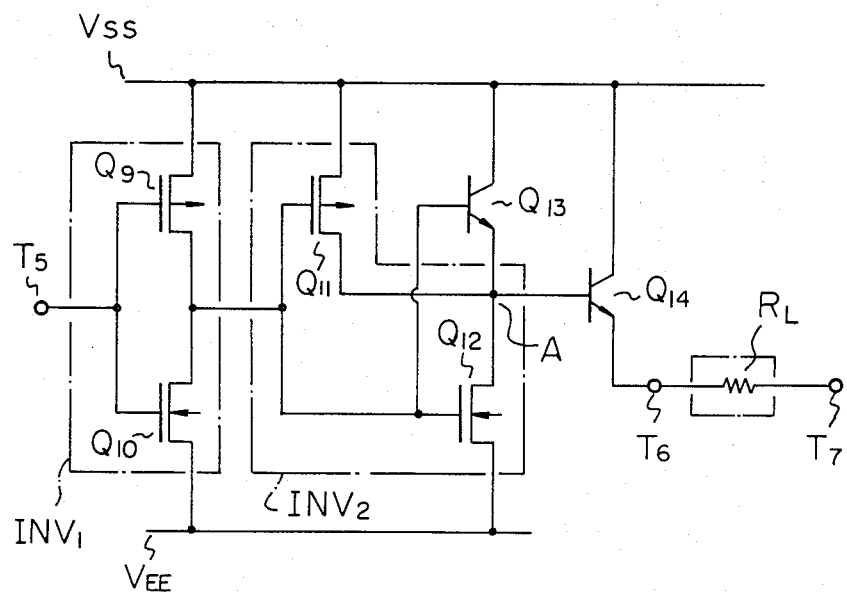
FIG. 7 is a circuit diagram of a level converter circuit in accordance with a second embodiment of the present invention.

A level converter circuit in accordance with another embodiment of the present invention is illustrated in FIG. 7. The level converter circuit of FIG. 7 comprises P-channel MOS transistors $Q_9$ and $Q_{11}$, N-channel MOS transistors $Q_{10}$ and $Q_{12}$, and NPN type bipolar transistors $Q_{13}$ and $Q_{14}$. The P-channel MOS transistor $Q_9$ and the N-channel MOS transistor $Q_{10}$ are connected in series between the higher voltage supply line $V_{SS}$ and the lower voltage supply line $V_{EE}$ and form a complementary metal-oxide semiconductor (CMOS) inverter $INV_1$. P-channel MOS transistor $Q_{11}$ and N-channel MOS transistor $Q_{12}$ are also connected in series between the voltage supply lines $V_{SS}$ and $V_{EE}$ and form a CMOS inverter $INV_2$. The input of inverter $INV_1$ is connected to input terminal $T_5$, and the output of inverter $INV_1$ is connected to the input of inverter $INV_2$ and to the base of the bipolar transistor $Q_{13}$. The collectors of the bipolar transistors $Q_{13}$ and $Q_{14}$ are both connected to the voltage supply line $V_{SS}$. The emitter of the bipolar transistor $Q_{13}$ and the base of the bipolar transistor $Q_{14}$ are connected to the output of the inverter $INV_2$, that is, the junction A between the source of the MOS transistor $Q_{11}$ and the drain of the MOS transistor $Q_{12}$. The emitter of bipolar transistor $Q_{14}$ is connected to the output terminal $T_6$. Output terminal $T_6$ is connected to the external voltage supply terminal $T_7$ through a dummy load resistor $R_L$.

Figure 8:
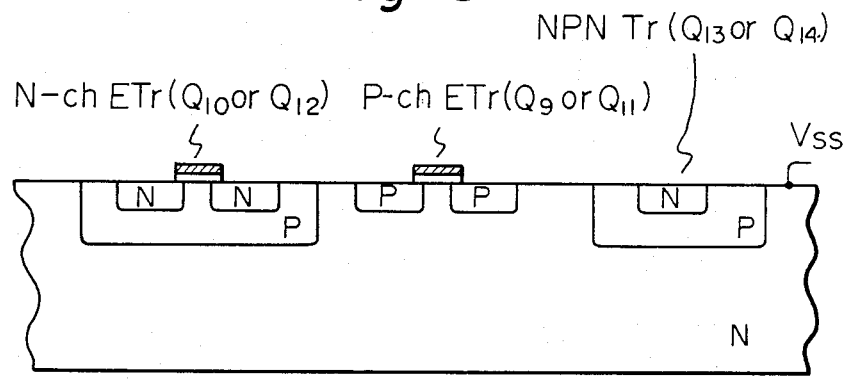
FIG. 8 is a sectional view of a semiconductor substrate on which the circuit of FIG. 7 is formed.

The level converter circuit of FIG. 7 may be formed on the N-type semiconductor substrate as illustrated in FIG. 8. On the N-type substrate of FIG. 8, N-channel MOS transistor $Q_{10}$ or $Q_{12}$, P-channel MOS transistor $Q_9$ or $Q_{11}$, and NPN type bipolar transistor $Q_{13}$ or $Q_{14}$ are formed.

In the level converter circuit of FIG. 7, a logic signal is applied to input terminal $T_5$. When the "H" level signal ($V_{SS}$) is applied to input terminal $T_5$, the output signal of inverter $INV_1$ becomes the "L" level ($V_{EE}$). Accordingly, P-channel MOS transistor $Q_{11}$ is turned ON, and N-channel MOS transistor $Q_{12}$ and bipolar transistor $Q_{13}$ are turned OFF. Thus, the base voltage of bipolar transistor $Q_{14}$ becomes the $V_{SS}$ level, and the emitter voltage of bipolar transistor $Q_{14}$, that is, the voltage of output terminal $T_6$, becomes the value $V_{SS}-V_{BE}$, just as in the circuit of FIG. 3. When the "L" level signal ($V_{EE}$) is applied to input terminal $T_5$, the output signal of inverter $INV_1$ becomes the "H" level ($V_{SS}$), and, accordingly, the P-channel MOS transistor $Q_{11}$ is turned OFF and the N-channel MOS transistor $Q_{12}$ and bipolar transistor $Q_{13}$ are turned ON. Thus, the emitter voltage of the bipolar transistor $Q_{13}$, that is, the base voltage of bipolar transistor $Q_{14}$, becomes the voltage $V_{SS}-V_{BE}$, and the emitter voltage of bipolar transistor $Q_{14}$, that is the voltage of output terminal $T_6$ becomes the voltage $V_{SS}-2V_{BE}$, just as in the circuit of FIG. 3.

As described above, according to the present invention, there is provided a level converter circuit which comprises MOS transistors and bipolar transistors formed on the same IC substrate. The level converter circuit converts the MOS level signals obtained from the MOS transistors of the inner circuit into an arbitrary voltage level by means of the bipolar transistors. The level converter circuit according to the present invention has the following advantages:

1. The TTL level signals output from the MOS RAM device can be readily converted into ECL signals.
2. It is possible to couple the ECL logic circuit directly to a RAM or other MOS circuit without using a prior art TTL to ECL converter.
3. The integration scale of IC's can be increased.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to as falling within the scope of the invention.

I claim:

1. A level converter circuit for converting a first logic signal, having a lower voltage supply as a base potential, into a second logic signal, having a higher voltage supply as a base potential, the level converter circuit comprising:
- an input terminal for receiving the first logic signal;
- an output terminal for outputting the second logic signal;
- a first bipolar transistor having a collector operatively connected to the higher voltage supply, having an emitter and having a base;
- a second bipolar transistor, having a collector operatively connected to the higher voltage supply, having an emitter operatively connected to said output terminal, and having a base operatively connected to said emitter of said first bipolar transistor; and
- means, operatively connected to said input terminal and said second bipolar transistor, for turning on only said second bipolar transistor or both said first and second bipolar transistors, in response to the logic level of the first logic signal, said turning on means including:
  - a first MOS transistor operatively connected in parallel with said first bipolar transistor; and
  - a second MOS transistor connected to the lower voltage supply and having a gate operatively connected to said base of said first bipolar transistor.

2. A level converter circuit according to claim 1, wherein said first MOS transistor is a depletion type transistor.

3. A level converter circuit according to claim 1, wherein said first MOS transistor and said second MOS transistor form a CMOS inverter.

4. A level converter circuit, having a first input terminal for receiving a first input signal and a second input terminal for receiving a second input signal, and an output terminal for outputting a converted signal, the level converter circuit being operatively connectable to a first voltage supply and a second voltage supply having a voltage higher than that of the first voltage supply, the level converter circuit comprising:
- a first transistor, operatively connected to the second voltage supply, having a gate operatively connected to the first input terminal for receiving the first input signal;
- a second transistor, operatively connected to the first voltage supply, having a gate operatively connected to the second input terminal for receiving the second input signal;
- a first bipolar transistor, having a collector operatively connected to the second voltage supply, having a base operatively connected to receive the second input signal and having an emitter;
- a second bipolar transistor, having a collector operatively connected to the second voltage supply, having a base operatively connected to the emitter of said first bipolar transistor and having an emitter operatively connected to the output terminal for outputting the converted signal.

5. A level converter circuit having an input terminal for receiving an input logic signal and an output terminal for outputting a converted logic signal, the level converter circuit being operatively connectable to a first voltage supply and a second voltage supply having a voltage higher than that of the first voltage supply, the level converter circuit comprising:
- a first transistor of a first conductivity type, operatively connected to the first voltage supply and to the input terminal, for receiving the input logic signal;
- a first transistor of a second conductivity type, operatively connected in series between said first transistor and the second voltage supply, for receiving the input logic signal, said first transistor of the first conductivity type and said first transistor of the second conductivity type forming a connection node, at the point where they are operatively connected, for outputting a signal;
- a second transistor of the first conductivity type, operatively connected between the first voltage supply and the output terminal and operatively connected to said connection node, for receiving the output signal from said connection node;
- a second transistor of the second conductivity type, operatively connected to said second transistor of the first conductivity type, the second voltage supply and said connection node, for receiving the output signal from said connection node;
- a first bipolar transistor having a collector operatively connected to the second voltage supply, having a base operatively connected to said second transistor of the first conductivity type and having an emitter operatively connected to said second transistor of the first conductivity type and said second transistor of the second conductivity type; and
- a second bipolar transistor having a collector operatively connected to the second voltage supply, having a base operatively connected to said emitter of said first bipolar transistor, and having an emitter operatively connected to the output terminal for outputting the converted logic signal.

6. A level converter circuit according to claim 5, wherein said first transistor of the first conductivity type and said first transistor of the second conductivity type form a first inverter.

7. A level converter circuit according to claim 6, wherein said second transistor of the first conductivity type and said second transistor of the second conductivity type form a second inverter.

8. An integrated semiconductor device, operatively connected to first and second power supplies, the first power supply having a voltage lower than the voltage of the second power supply, and operatively connectable to receive a first logic signal having a base potential the same as the voltage of the first power supply, said integrated semiconductor device, comprising:
- a semiconductor substrate;
- a MOS-type random access memory device having an output portion formed on said semiconductor substrate; and
- a level converter circuit, operatively connected to receive the first logic signal and formed on said semiconductor substrate adjacent to said output portion of said MOS-type random access memory device, said level converter circuit converting the first logic signal into a second logic signal having a base potential the same as the voltage of the second power supply, said level converting circuit comprising:
  - an input terminal operatively connected to receive the first logic signal;

a first bipolar transistor having a collector operatively connected to the second voltage supply, having a base operatively connected to said input terminal, and having an emitter;

a second bipolar transistor, having a collector operatively connected to the second voltage supply, having a base operatively connected to said emitter of said first bipolar transistor and having an emitter;

means, operatively connected to said input terminal and said second bipolar transistor, for turning on said second bipolar transistor in response to the first logic signal applied to said input terminal so that the first logic signal is converted into the second logic signal and output at the emitter of said second bipolar transistor; and an output terminal, operatively connected to the emitter of said second bipolar transistor, for receiving and outputting the second logic signal.

* * * * *

UNITED STATES PATENT AND TRADEMARK OFFICE
CERTIFICATE OF CORRECTION

PATENT NO. : 4,538,076
DATED : AUGUST 27, 1985
INVENTOR(S) : HIROSHI SHIMADA

It is certified that error appears in the above-identified patent and that said Letters Patent is hereby corrected as shown below:

Col. 1, line 50, "into "L"" should be --into the "L"--.

Col. 2, line 26, "28" should be --20--.

Signed and Sealed this

Nineteenth Day of November 1985

[SEAL]

Attest:

Attesting Officer

DONALD J. QUIGG

Commissioner of Patents and Trademarks